(12) United States Patent
Champeix et al.

(10) Patent No.: US 10,770,411 B2
(45) Date of Patent: Sep. 8, 2020

(54) DEVICE COMPRISING A STACK OF ELECTRONIC CHIPS

(71) Applicant: STMicroelectronics (Rousset) SAS, Rousset (FR)

(72) Inventors: Clement Champeix, Aix-en-Provence (FR); Nicolas Borrel, Martigues (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 16/382,509

(22) Filed: Apr. 12, 2019

(65) Prior Publication Data

US 2019/0237415 A1 Aug. 1, 2019

Related U.S. Application Data

(62) Division of application No. 15/609,783, filed on May 31, 2017, now Pat. No. 10,347,595.

(30) Foreign Application Priority Data

Oct. 31, 2016 (FR) ...................................... 16 60568

(51) Int. Cl.
*H01L 25/00* (2006.01)
*H01L 23/00* (2006.01)
*H01L 25/065* (2006.01)
*H01L 23/48* (2006.01)

(52) U.S. Cl.
CPC .......... *H01L 23/576* (2013.01); *H01L 23/481* (2013.01); *H01L 25/0657* (2013.01); *H01L 2225/06513* (2013.01); *H01L 2225/06527* (2013.01); *H01L 2225/06541* (2013.01); *H01L 2225/06565* (2013.01)

(58) Field of Classification Search
CPC . H01L 23/576; H01L 23/481; H01L 25/0657; H01L 2225/06565; H01L 2225/06541; H01L 2225/06513; H01L 2225/06527
USPC .......................................................... 327/565
See application file for complete search history.

(56) References Cited

U.S. PATENT DOCUMENTS

| | | | |
|---|---|---|---|
| 7,889,778 B2 * | 2/2011 | Marinet | G06F 21/77 375/140 |
| 7,898,090 B1 * | 3/2011 | Eaton | H01L 23/49816 257/777 |
| 2003/0008432 A1 | 1/2003 | Kux et al. | |

(Continued)

FOREIGN PATENT DOCUMENTS

| | | | | |
|---|---|---|---|---|
| CN | 1349660 A | 5/2002 | | |
| CN | 105474390 A | 4/2016 | | |
| FR | 2910708 A1 * | 6/2008 | ............ | H01L 23/48 |

(Continued)

*Primary Examiner* — Metasebia T Retebo
(74) *Attorney, Agent, or Firm* — Slater Matsil, LLP

(57) ABSTRACT

A method of protecting a first chip in a multi-chip stack includes determining an electrical characteristic of a conductive loop. The conductive loop extends over a top portion of the first chip. The conductive loop also extends through the first chip and within a top portion of a second chip. The top portion of the second chip is adjacent to a bottom portion of the first chip. The method further includes determining whether the electrical characteristic indicates that an attack is being made to determine contents or operation of the first chip.

24 Claims, 5 Drawing Sheets

(56) References Cited

U.S. PATENT DOCUMENTS

2014/0091829 A1* 4/2014 Yamayose ...... G01R 31/318513
　　　　　　　　　　　　　　　　　　　324/762.01
2016/0155679 A1　6/2016 Davies et al.

FOREIGN PATENT DOCUMENTS

| FR | 2910708 A1 | 6/2008 |
|----|------------|--------|
| WO | 2011155114 A1 | 12/2011 |
| WO | 2015000813 A1 | 1/2015 |

* cited by examiner

DEVICE COMPRISING A STACK OF ELECTRONIC CHIPS

CROSS-REFERENCE TO RELATED APPLICATIONS

This application is a divisional application of U.S. patent application Ser. No. 15/609,783 filed May 31, 2017, which claims the priority benefit of French patent application number 16/60568, filed on Oct. 31, 2016, all of which are incorporated herein by reference in their entirety.

TECHNICAL FIELD

The present disclosure relates to the field of electronic chips and, in particular embodiments, to a device comprising a stack of interconnected electronic chips.

BACKGROUND

Certain electronic chips, such as bank card chips, may contain confidential data which may be coveted by pirates. Such confidential data may be contained in circuits located on the front surface side of the chip. To obtain the data, a pirate may carry out an attack from the back side of the chip.

In a type of attack, called etch attack, the pirate etches a portion of the back side of the chip. From this etched portion, the pirate makes cavities having a width of a few micrometers, for example, by using an ion beam, which extend towards the front side until the circuits have been reached. Electric contacts with circuit elements are then created in the cavities, and the pirate uses these contacts to analyze the chip in operation.

In another type of attack, the pirate for example scans the back side of the chip with laser pulses. The impact of the laser disturbs the chip operation. The observation of the consequences of such disturbances on the activity of the circuits enables the pirate to successfully complete the attack. To disturb the chip operation, the pirate may also apply positive or negative potentials by means of a probe in contact with the back side, or induce currents or voltages in elements of the circuits by means of a coil arranged close to the back side.

This type of attack is called fault injection attack.

Such a chip comprising confidential data may be comprised in a stack of interconnected chips.

SUMMARY

The protection against attacks and, in particular against back side attacks, of a chip contained in a stack of interconnected chip is here considered.

Thus, an embodiment provides a device comprising a first chip having a front side and a back side. A second chip is stacked with the first chip and located on the back side of the first chip. A first loop comprises first and second through vias located in the first chip. Each through via has a first end on the front side of the first chip and a second end on the back side of the first chip. A first track that connects the first ends of the first and second through vias is located in the first chip on the front side thereof and a second track that connects the second ends of the first and second through vias is located in the second chip. The first chip comprises a first circuit for detecting an electrical characteristic of the first loop.

According to an embodiment, the first chip comprises on its back side first and second connection pads respectively connected to the first and second through vias and the second chip comprises third and fourth connection pads connected to the second track, the first and second pads being respectively soldered to the third and fourth pads of the second chip.

According to an embodiment, the detection circuit is capable of detecting at least one of the following electrical characteristics of the first loop a lack of electric continuity of the first loop; a difference between the value of the electric resistance of the first loop and a reference value, and a difference between the time taken by an electric pulse to flow through the first loop and a reference duration.

According to an embodiment, the first loop further comprises at least third and fourth through vias located in the first chip, the first loop alternately running through the first chip and through the second chip.

According to an embodiment, the first track has a serpentine pattern.

According to an embodiment, the second track has a serpentine pattern.

According to an embodiment, the second chip has a front side and has a back side facing the first chip, the second track being located on the front side of the second chip, the second chip comprising: fifth and sixth through vias connecting the second track to the first and second through vias; and a second circuit for detecting an electrical characteristic of the first loop.

According to an embodiment, the device further comprises at least one second loop comprising seventh and eighth through vias, located in the first chip and each having a first end on the front side of the first chip and a second end on the back side of the first chip; and a third track, connecting the first ends of the seventh and eighth through vias and located in the first chip on the front side thereof; and a fourth track, connecting the second ends of the seventh and eighth through vias and located in the second chip.

According to an embodiment, the second chip comprises a third circuit for detecting an electrical characteristic of the second loop.

According to an embodiment, the first circuit is capable of detecting an electrical characteristic of the first and second loops.

According to an embodiment, the first circuit is capable of detecting at least one of the following electrical characteristics of the first and second loops: an electric continuity between the first loop and the second loop; and a difference between the electric resistance of the first loop and that of the second loop.

According to an embodiment, the first circuit is capable of triggering the implementation of countermeasures intended to stop an attack of the first chip when said electrical characteristic is detected.

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
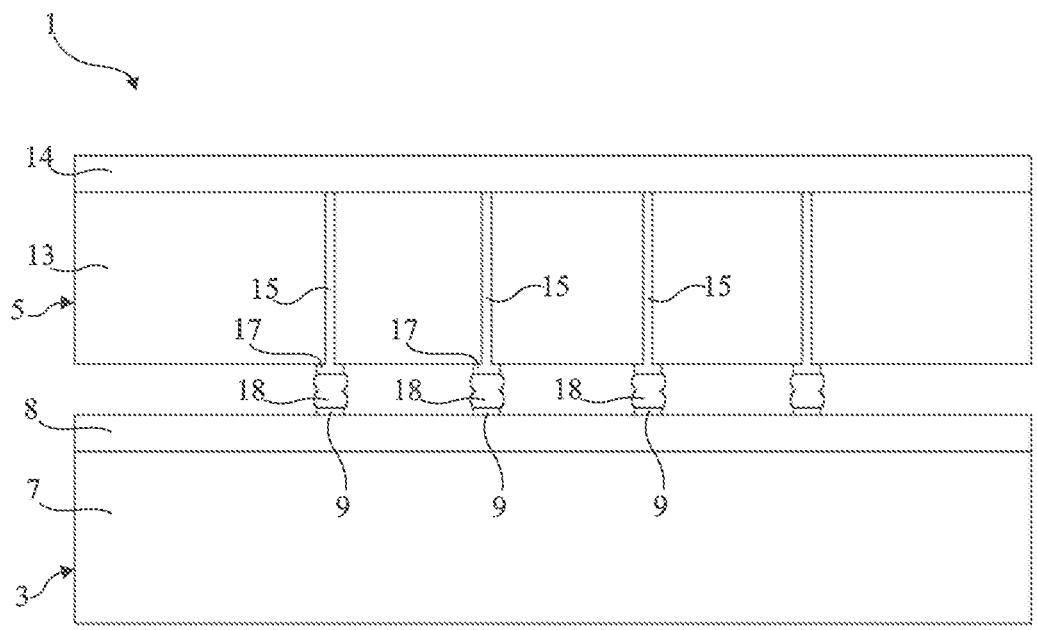
FIG. 1 is a simplified cross-section view of an example of a device comprising a stack of electronic chips.

The same elements have been designated with the same reference numerals in the various drawings and, further, the various drawings are not to scale. For clarity, only those steps and elements which are useful to the understanding of the described embodiments have been shown and are detailed. In particular, the circuits comprised in the chips of the described devices, particularly circuits capable of containing confidential data to be protected, have not been detailed. Further, the described devices comprise detection circuits, the forming of which has not been detailed. The forming of such detection circuits is indeed within the abilities of those skilled in the art based on the functional indications of the present description.

In the following description, when reference is made to terms qualifying absolute position, such as terms "high", "low", etc. or relative position, such as terms "above", "under", "upper", "lower", etc., reference is made to the orientation of the concerned element in the concerned drawings, it being understood that, in practice, the described devices may be oriented differently.

FIG. 1 is a simplified cross-section view illustrating an example of a device 1 comprising a stack of electronic chips. Device 1 comprises a chip 3, and a chip 5 located above chip 3. Chips 3 and 5 each have a front side in the upper portion and a back side in the lower portion. Chip 3 is thus located on the back side of chip 5.

Chip 3 comprises a semiconductor substrate 7. Substrate 7 comprises, on its upper surface side (or front side), semiconductor elements of components such as transistors or diodes of circuits not shown. Chip 3 further comprises an interconnection layer 8 covering substrate 7 on the upper surface side thereof. Interconnection layer 8 contains, within insulating layers, conductive tracks, not shown, which connect the components of the circuits of chip 3. Further, chip 3 comprises, on the upper surface of interconnection layer 8, connection pads 9 electrically connected to the circuits of chip 3 by tracks of layer 8.

Chip 5 comprises a semiconductor substrate 13. Chip 5 comprises circuits located on its front side, these circuits comprising components formed inside and on top of substrate 13 on the upper surface side of substrate 13. Chip 5 comprises an interconnection layer 14 covering substrate 13 on its upper surface side (or front side). Interconnection layer 14 contains, within insulating layers, conductive tracks, not shown, which connect the components of the circuits of chip 5. Chip 5 further comprises through vias 15. "Through via" here means a conductive through via thoroughly crossing substrate 13, from the upper surface of the substrate to the lower surface (or back side) of the substrate. Vias 15 each have, on the front side, an end connected to the circuits of chip 5 by tracks of layer 14 and, on the back side, an end connected to a connection pad 17 located on the back side of upper chip 5. Each connection pad 17 of upper chip 5 is soldered to a connection pad 9 of lower chip 3. A filler material 18 may be provided between pads 9 and 17 to perform the soldering. Connections between the circuits of chip 3 and those of chip 5 are thus obtained.

The case where the circuits of upper chip 5 contain confidential data coveted by a pirate is here considered. In the presence of chip 3 on the back side of chip 5, the pirate cannot attack the back side of chip 5. To obtain the coveted data, the pirate should thus first separate pads 9 and 17 to remove chip 3 and access the back side of chip 5. The pirate can then carry out the attack from the back side of chip 5. During the attack, the pirate connects chips 5 to a power source to set it to an operating mode. The pirate may further electrically reconnect pads 9 and 17 with conductive wires, to restore the electric connection between the two chips while keeping an access to the back side of chip 5.

It is here desired, in a device comprising a chip stack, to protect a chip against attacks from its back side when the chip has its back side facing another chip of the stack.

Figure 2:
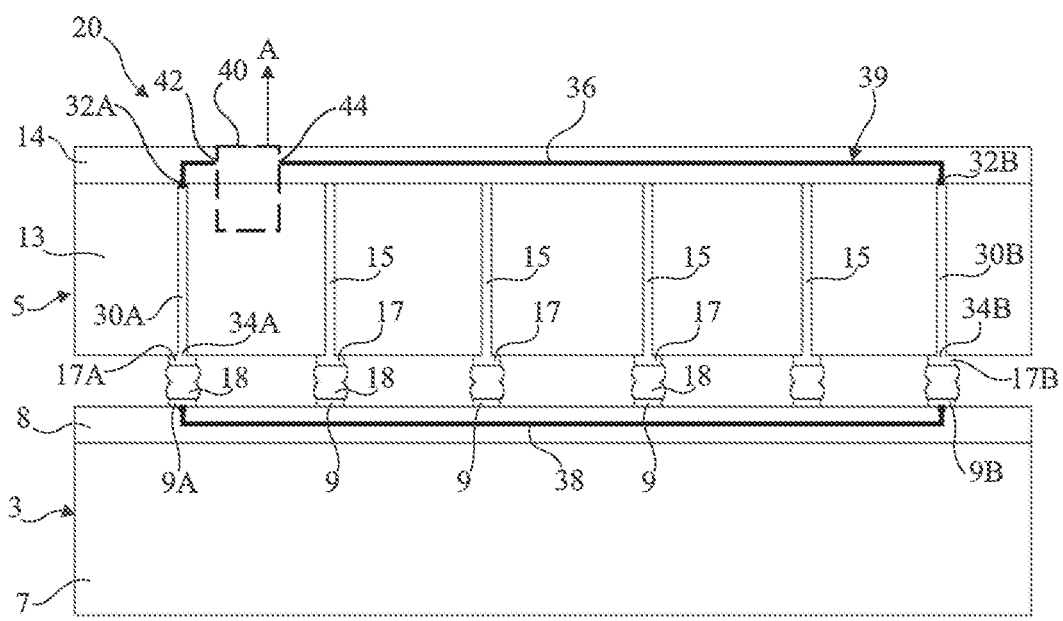
FIG. 2 is a simplified cross-section view of an embodiment of a device comprising a stack of electronic chips.

FIG. 2 is a simplified cross-section view of an embodiment of a device comprising a stack of electronic chips. The device of FIG. 2 comprises the same elements as device 1 of FIG. 1, arranged substantially in the same way. The elements common to the two devices will not be detailed again hereafter.

Upper chip 5 of device 20 comprises two additional conductive through vias 30A and 30B. Each of vias 30A and 30B has an end, respectively 32A, 32B, located on the front side of chip 5, and another end, respectively 34A, 34B, located on the back side of chip 5. Upper ends 32A and 32B of vias 30A and 30B are electrically connected together by a conductive track 36 located in interconnection layer 14 of chip 5. Lower ends 34A and 34B of vias 30A and 30B are electrically connected together by a conductive track 38 located in interconnection layer 8 of lower chip 3. In the shown example, upper chip 5 comprises two additional connection pads 17A and 17B located on the back side of upper chip 5 and respectively connected to ends 34A and 34B of vias 30A and 30B. Further, lower chip 3 comprises two additional connection pads 9A and 9B located on the front side of chip 3 and respectively connected to a first and to a second end of track 38, pads 17A and 17B being respectively soldered to pads 9A and 9B. The device thus comprises a conductive loop 39 comprising through vias 30A and 30B series-connected by tracks 36 and 38.

Upper chip 5 further comprises a detection circuit 40 configured to monitor an electrical characteristic of loop 39, for example, a lack of electric continuity of loop 39.

In normal operation, the presence of lower chip 3 on the back side of upper chip 5 prevents the pirate from accessing the back side of chip 5 to carry out an attack. Loop 39 is intact, and circuit 40 detects no attack.

During an attack attempt aiming at obtaining confidential data from upper chip 5, the pirate removes lower chip 3 to access the back side of chip 5. To achieve this, the pirate separates connection pads 17, 17A, 17B of chip 5 from connection pads 9, 9A, 9B of chip 3. Due to the fact that part of loop 39 is comprised within lower chip 3, loop 39 is broken. When chip 5 is set back to the operating mode by the pirate to analyze its operation, the interruption of loop 39 is detected by circuit 40, which then emits an alert signal A. After the generation of the alert signal in chip 5, countermeasures are taken to stop the attack, for example, by destroying the confidential data or by stopping the operation of the circuits of chip 5.

Chip 5 of device 20 is thus protected against attacks from its back side.

As an example, lower chip 3 has lateral dimensions greater than or equal to those of upper chip 5 and the entire back side of chip 5 faces chip 3. As a variation, chip 3 is located opposite a portion only of the back side of chip 5, corresponding to the critical circuits to be protected of chip 5.

As an example, to be able to detect a discontinuity of loop 39, detection circuit 40 is placed in series with a conductive portion of loop 39 for which an electrical characteristic is desired to be detected. In other words, circuit 40 is comprised within loop 39. As an example, detection circuit 40 is located between nodes 42 and 44 located on track 36 to interrupt track 36. As a variation, the detection circuit is located between track 36 and end 32A of via 30A or between track 36 and end 32B of via 30B.

Detection circuit 40 is then configured to detect an electrical characteristic of the conductive portion of loop 39 located outside of detection circuit 40. As a variation, rather than monitoring the electric continuity of loop 39, detection circuit 40 may be capable of monitoring one or a plurality of other electrical characteristics of the loop 39, for example, of comparing the value of the electric resistance of loop 39 between nodes 42 and 44 with a reference value, or also of comparing with a reference duration the time taken by an electric pulse emitted by circuit 40 to flow through the loop. An advantage of such variations is that they enable to detect that chips 3 and 5 have been reconnected by conductive wires after having been separated, which cannot be detected by a simple verification of the electric continuity of loop 39.

Figure 3:
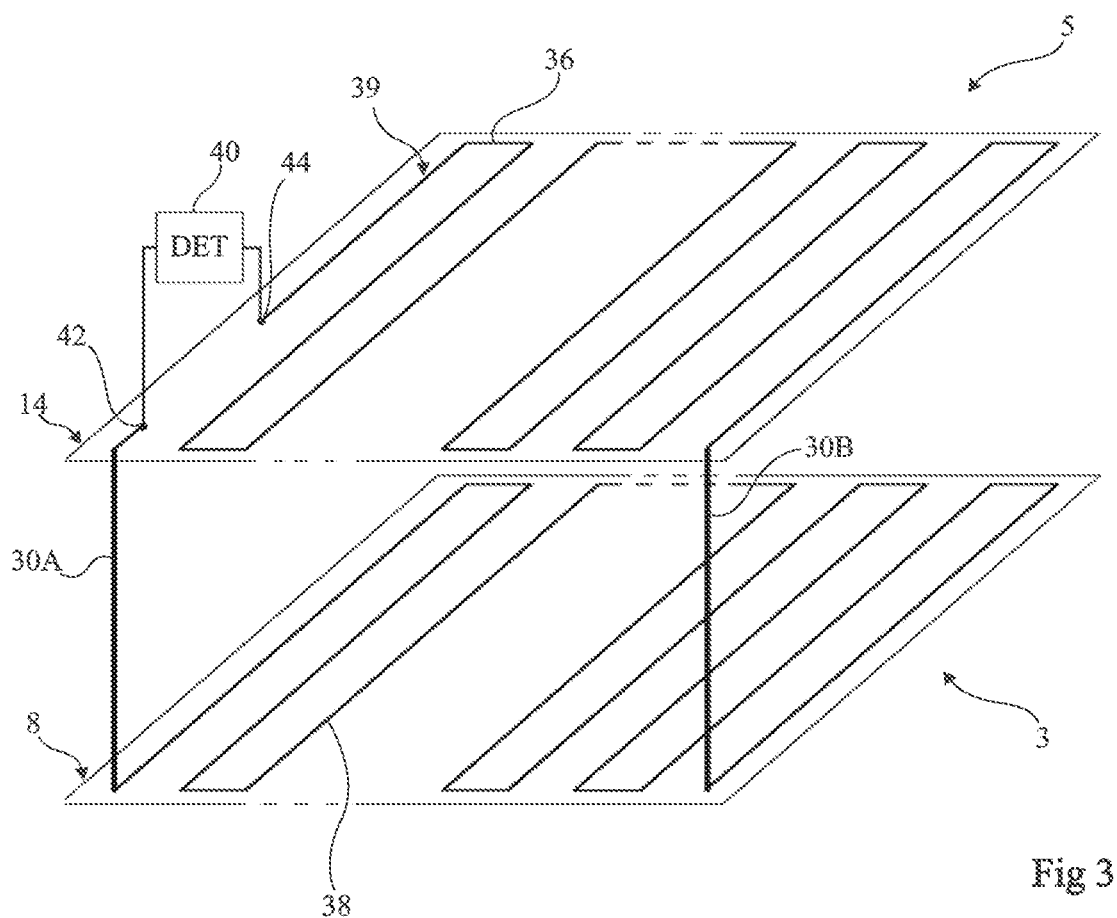
FIG. 3 is a perspective diagram illustrating protection elements of a device comprising a stack of electronic chips according to an embodiment.

FIG. 3 is a perspective diagram illustrating in further detail an embodiment of loop 39 of the device of FIG. 2. Only tracks 36 and 38, vias 30A and 30B, and circuit 40 have been shown in FIG. 3. Interconnection layers 8 and 14 have been schematized by two parallel planes.

As an example, track 36 of upper layer 5 has in top view the shape of a serpentine arranged in a plane substantially parallel to the upper surface of the chip. The serpentine may be arranged at a metallization level of the chip located above that of the chip circuit interconnection tracks. As an example, the critical circuits to be protected of chip 5 are partly or totally arranged in an area of the chip having the serpentine pattern extending therein, in top view. As an example, the critical circuits are partly or totally arranged in an area of the chip where each point is located in top view between two portions of track 36 separated by a distance shorter than 5 µm, preferably shorter than 2 µm.

An advantage of this layout of track 36 is that it enables to further protect chip 5 against a possible attack from its front side. Indeed, if a pirate intended to access the components of the critical circuits of chip 5 through interconnection layer 14, this would inevitably interrupt track 36, and circuit 40 would detect the attack. Upper chip 5 is thus advantageously protected by a single circuit 40 both against attacks from its front side and against attacks from its back side. The protection of upper chip 5 is thus obtained with a particularly small number of components.

In the example of FIG. 3, track 38 of lower chip 3 also has in top view the shape of a serpentine, for example, identical or similar to the serpentine shape of track 36.

This enables to protect chip 5, still by means of the same circuit 40, against an attack where the pirate would attempt to remove a portion only of lower chip 3, for example, by etching a through opening into lower chip 3, to access a portion of the back side of chip 5 without separating the two chips. Due to the serpentine pattern of track 38, during such an attack attempt, the pirate would inevitably interrupt track 38, and the attack would thus be detected by circuit 40.

As an example, the critical circuits to be protected of chip 5 are partly or totally arranged opposite an area of chip 3 having the serpentine pattern of track 38 extending therein in top view. To access the components of the critical circuits of chip 5 through the back side thereof, the pirate should remove from chip 3 a portion having lateral dimensions greater than those of the accesses to the components that the pirate would form if he/she intended to attack chip 5 from its front side. Thus, the serpentine pattern of track 38 may be looser than the serpentine pattern of track 36, of example, the critical circuits of chip 5 are partly or totally arranged in an area having each point located in top view between two portions of track 38 separated by a distance shorter than 50 µm, preferably shorter than 20 µm. As a variation, the serpentine patterns of tracks 38 and 36 are similar, the critical circuits of chip 5 being partly or totally arranged in an area having each point located in top view between two portions of track 38 separated by a distance shorter than 5 µm, preferably shorter than 2 µm.

Figure 4:
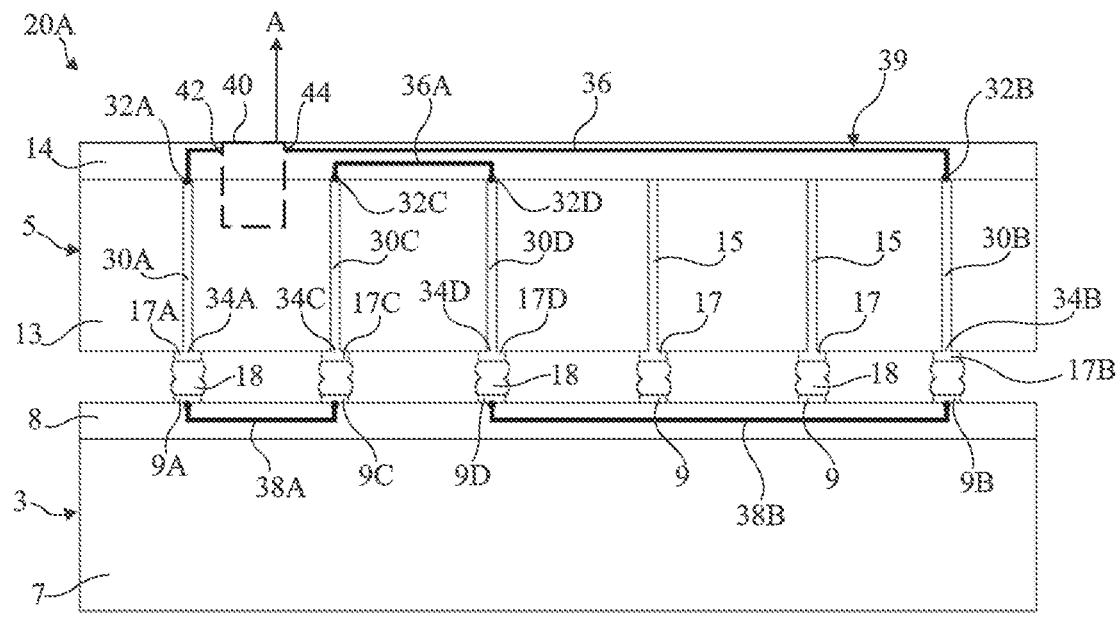
FIG. 4 is a simplified cross-section view of an alternative embodiment of a device comprising a stack of electronic chips.

FIG. 4 is a simplified cross-section view of an alternative embodiment of device 20 of FIG. 2. FIG. 4 more particularly illustrates a device 20A comprising elements similar to those of device 20 of FIG. 2, arranged similarly. The elements common to the two devices will not be described again hereafter. In the following, only the differences between devices 20A and 20 will be highlighted.

In device 20A, loop 39 comprises additional conductive through vias 30C and 30D located in chip 5. Vias 30C and 30D each have an end, respectively 32C and 32D, on the front side of chip 5, and the other end, respectively 34C and 34D, on the back side of chip 5. Ends 32C and 32D of vias 30C and 30D are connected by an additional track 36A located in interconnection layer 14 of chip 5. Ends 34C and 34D are connected to additional connection pads, respectively 17C and 17D, located on the back side of chip 5.

Track 38 of chip 3 has been replaced with tracks 38A and 38B located in interconnection layer 8. Further, chip 3 comprises additional connection pads 9C and 9D located on the front side of chip 3. Track 38A connects connection pad 9A to connection pad 9C, and track 38B connects connection pad 9B to connection pad 9D. Pads 9C and 9D are respectively soldered to pads 17C and 17D.

Loop 39 of device 20A thus comprises the four vias 30A, 30B, 30C, 30D series-connected by tracks 36, 36A, 38A, 38B. Throughout loop 39, tracks 36, 36A, 38A, 38B are alternately located in upper chip 5 and in lower chip 3. In other words, the portion of loop 39 for which an electrical characteristic is desired to be monitored alternatively crosses chip 5 and chip 3 a plurality of times.

Although, in the shown example, chip 5 comprises four through vias 30A, 30B, 30C, 30D arranged in chip 5, other examples are possible where loop 39 comprises an even number greater than four of vias series-connected by tracks alternately located in upper chip 5 and in lower chip 3.

An advantage of the embodiment of FIG. 4 is that it enables to reinforce the protection of chip 5 against attacks. Indeed, as indicated above, a pirate coveting the confidential data of upper chip 5 might, after having separated chips 3 and 5, attempt to reconnect them, for example, with conductive wires, to keep the electric connection between the two chips while preserving an access to the back side of upper chip 5. Thereby, the electric continuity of loop 39 would be restored, which would prevent the detection of the attack by circuit 40. However, such a reconnection is all the more difficult to perform as the number of vias to be reconnected is high. Device 20A of FIG. 4 thus has a reinforced protection level as compared with device 20 of FIG. 2.

Figure 5:
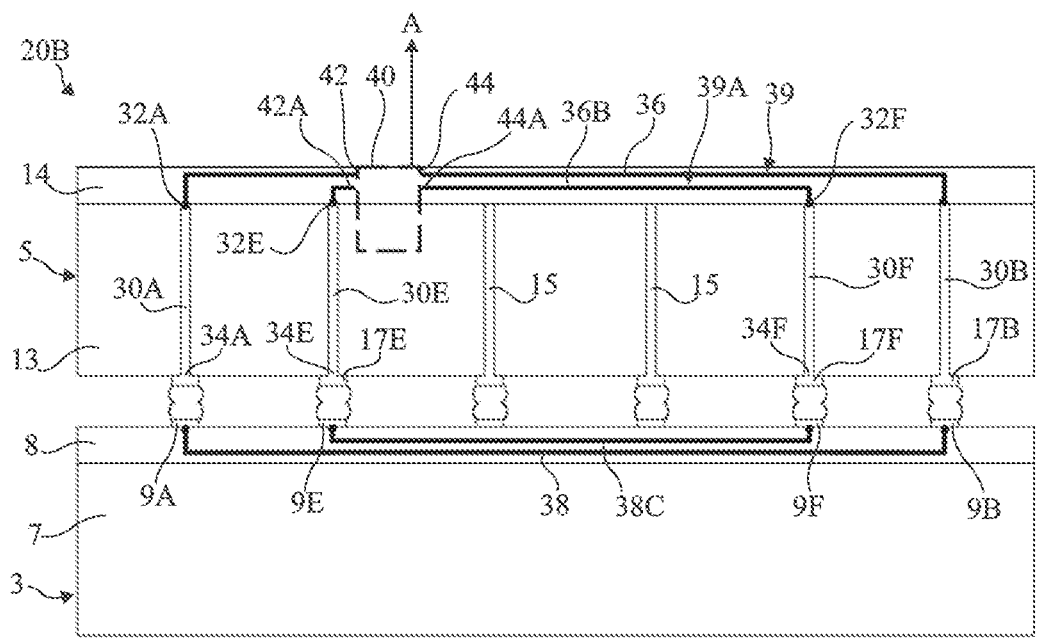
FIG. 5 is a simplified cross-section view of another alternative embodiment of a device comprising a stack of electronic chips.

FIG. 5 is a simplified cross-section view of another alternative embodiment of device 20 of FIG. 2. FIG. 5 more particularly illustrates a device 20B comprising elements similar to those of device 20 of FIG. 2, arranged similarly. The elements common to devices 20 and 20B will not be described again hereafter. In the following, only the differences between devices 20 and 20B will be highlighted.

Device 20B comprises an additional loop 39A comprising two additional conductive through vias 30E and 30F comprised in upper chip 5. Vias 30E and 30F have, on the front side, respective ends 32E and 32F and, on the back side, respective ends 34E and 34F. Ends 34E and 34F are connected to additional connection pads, respectively 17E and 17F, located on the back side of chip 5. Loop 39A further comprises an additional track 36B, located in interconnection layer 14 of upper chip 5 and connecting ends 32E and 32F of vias 30E and 30F. Loop 39A further comprises a track 38C comprised in interconnection layer 8 of lower chip 3. Track 38C interconnects additional connection pads 9E and 9F arranged on the front side of chip 3 and respectively soldered to pads 17E and 17F.

Loop 39A of device 20B thus comprises, series-connected and in the following order, in upper chip 5, via 30E, track 36B, and via 30F and, in lower chip 3, track 38C.

In this example, detection circuit 40 is placed not only in series with a conductive portion of loop 39, as previously described, but also in series with a conductive portion of loop 39A. In other words, circuit 40 is comprised within loop 39A. As an example, detection circuit 40 is located between nodes 42A and 44A located on track 36B so as to interrupt track 36B. As a variation, the detection circuit is located between track 36B and end 32E of via 30E or between track 36B and end 32F of via 30F.

Detection circuit 40 is then configured to detect an electrical characteristic of the conductive portion of loop 39A located outside of detection circuit 40. As an example, detection circuit 40 of device 20B is configured to detect an electrical characteristic of the assembly of the two loops 39 and 39A, for example, the presence of an electric connection between loops 39 and 39A or, for example, a difference between the electric resistance of loop 39 between nodes 42 and 44 and the electric resistance of loop 39A between nodes 42A and 44B.

An advantage of the embodiment of FIG. 5 is that it enables to reinforce the protection of chip 5 against attacks. Indeed, if a pirate coveting the confidential data of upper chip 5, after having separated chips 3 and 5, attempts to reconnect them, for example with conductive wires, he/she may end up creating an electric connection between the loops, such as a short-circuit, or creating a difference between the electric resistances of the loops. This is detected by circuit 40 when the pirate sets chip 5 back in operation to carry on the attack.

Figure 6:
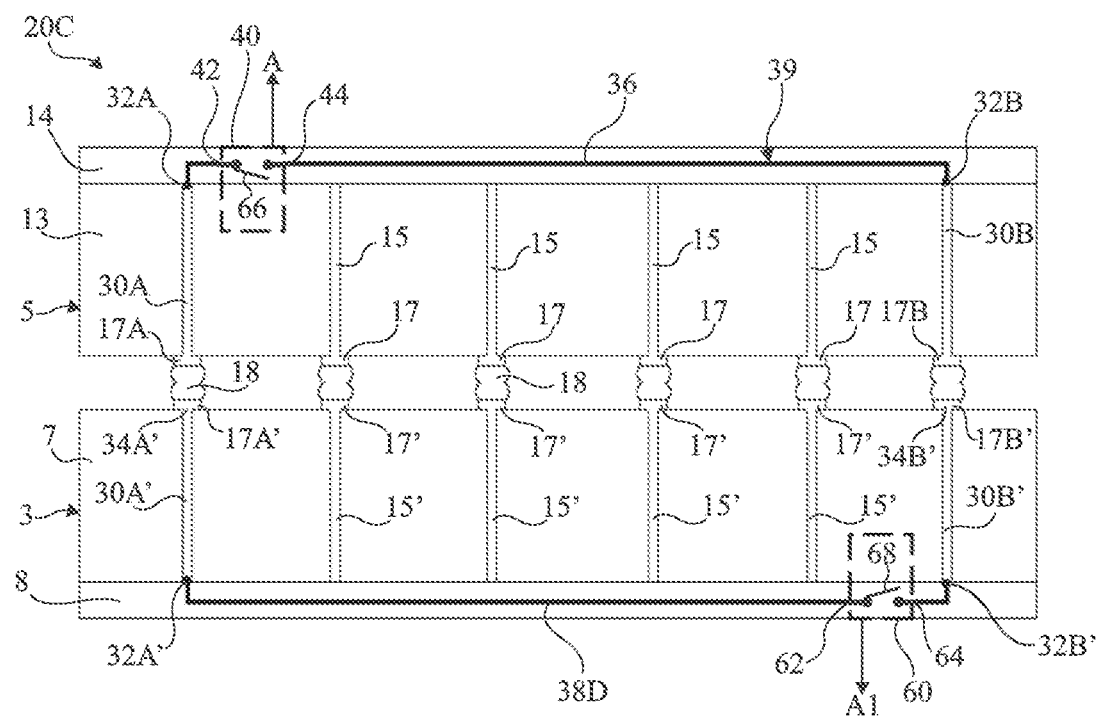
FIG. 6 is a simplified cross-section view of another alternative embodiment of a device comprising a stack of electronic chips.

FIG. 6 is a simplified cross-section view of another alternative embodiment of device 20 of FIG. 2. FIG. 6 more particularly illustrates a device 20C comprising elements similar to those of device 20 of FIG. 2. The elements common to the two devices will not be described again hereafter. In the following, only the differences between devices 20C and 20 will be highlighted.

Device 20C differs from device 20 of FIG. 2 essentially in that, in device 20C, lower chip 3 has its back side facing the back side of upper chip 5. In other words, in device 20C, the front side of chip 3 corresponds to its lower surface, and the back side of chip 3 corresponds to its upper surface.

Connection pads 9 of chip 3 have been replaced with connection pads 17' located on its back side. Pads 17' are connected to the circuits of lower chip 3 by conductive through vias 15'. The connection pads 17' of lower chip 3 are soldered to the connection pads 17 of upper chip 5.

Chip 3 further comprises two conductive through vias 30A' and 30B'. Through vias 30A' and 30B' thoroughly cross substrate 7 between the upper surface and the lower surface thereof.

Through vias 30A' and 30B' have, on the front side of chip 3, respective ends 32A' and 32B' and, on the back side of chip 3, respective ends 34A' and 34B'.

Ends 32A' and 32B' are interconnected by an additional track 38D located in interconnection layer 8 of lower chip 3. Ends 34A' and 34B' of vias 30A' and 30B' are connected to additional connection pads 17A' and 17B' located on the back side of lower chip 3. Pads 17A' and 17B' of lower chip 3 are respectively soldered to pads 17A and 17B of upper chip 5. Device 20C thus comprises a loop 39 comprising, in series and in the following order, in chip 5, via 30A, track 36, and via 30B, and, in chip 3, via 30B', track 38D, and via 30A'.

Lower chip 3 further comprises an additional detection circuit 60 capable of monitoring an electrical characteristic of loop 39. Circuit 60 is for example identical or similar to circuit 40. As an example, to detect a discontinuity of loop 39, detection circuit 60 is placed in series with a conductive portion of loop 39 for which an electrical characteristic is desired to be detected. In other words, circuit 60 is comprised within loop 39. As an example, detection circuit 60 is located between nodes 62 and 64 located on track 38D so as to interrupt track 38D. As a variation, the detection circuit is located between track 38D and end 32A' of via 30A' or between track 38D and end 32B' of via 30B'.

As an example, detection circuit 40 comprises a bypass switch 66 coupling nodes 42 and 44, enabling to connect nodes 42 and 44 to ensure the electric continuity of loop 39 within circuit 40. Similarly, detection circuit 60 may comprise a bypass switch 68 coupling nodes 62 and 64, enabling to connect nodes 62 and 64 to ensure the electric continuity of loop 39 within circuit 60. Each of detection circuits 40 and 60 may have a detection phase during which the detection circuit controls to the non-conductive state its bypass switch, respectively 66 and 68 and monitors an electrical characteristic of the portion of loop 39 located outside of the detection circuit. Circuits 40 and 60 are then configured so that bypass switch 66 of circuit 40 is on during the detection phase of circuit 60, and so that bypass switch 68 of circuit 60 is on during the detection phase of circuit 40, the detection phases of circuits 40 and 60 being separate.

The case where the circuits of lower chip 3 and those of upper chip 5 contain confidential data is here more particularly considered.

In normal operation, the presence of upper chip 5 on the back side of lower chip 3 prevents a pirate from accessing the back side of chip 3 to carry out an attack on chip 3, and the presence of lower chip 3 on the back side of upper chip 5 prevents a pirate from accessing the back side of chip 5 to carry out an attack on chip 5. Loop 39 is intact, and none of detection circuits 40 and 60 detects an attack.

In an attack attempt aiming at obtaining confidential data present in lower chip 3, the pirate removes lower chip 5 to access the back side of lower chip 3. The pirate then attempts operating chip 3. Loop 39 being interrupted or modified, detection circuit 60 generates an alert signal A1 which triggers countermeasures intended to defeat the attack of lower chip 3.

Similarly, if the pirate attempts to operate chip 5 to analyze the operation thereof, circuit 40 detects the interruption or the modification of loop 39 and triggers countermeasures intended to defeat the attack of chip 5.

Thus, in device 20C, each of chips 5 and 3 is protected against attacks from its back side.

Figure 7:
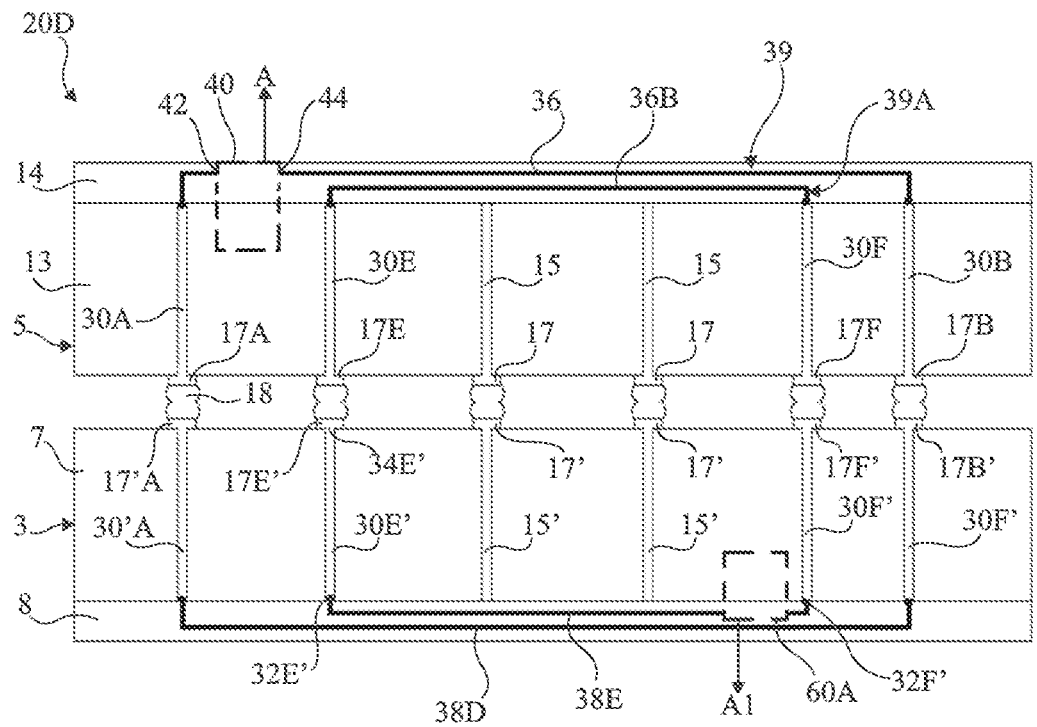
FIG. 7 is a simplified cross-section view of another alternative embodiment of a device comprising a stack of electronic chips.

FIG. 7 is a simplified cross-section view of an alternative embodiment of device 20C of FIG. 6. FIG. 7 more particularly illustrates a device 20D comprising elements similar to those of device 20C of FIG. 6, arranged similarly. The elements common to the two devices will not be described again hereafter. In the following, only the differences between devices 20D and 20C will be highlighted.

Device 20D comprises an additional loop 39A and a circuit 60A for detecting an electrical characteristic of loop 39A. Detection circuit 60A is for example identical or similar to detection circuit 40. In the shown example, detection circuit 60 of device 20C of FIG. 6 has been omitted.

Loop 39A has a portion located in chip 5. This portion is similar to the portion of loop 39A located in chip 5 of device 20B of FIG. 5, that is, loop 39A comprises two additional through vias 30E and 30F, and a track 36B comprised in interconnection layer 14 connecting ends 32E and 32F of vias 30E and 30F to respective pads 17E and 17F located on the back side of chip 5.

Loop 39A further comprises two additional through vias 30E' and 30F' comprised in lower chip 3. Vias 30E' and 30F' have, on their front side, respective ends 32E' and 32F' and, on their back side, ends 34E' and 34F'. Ends 34E' and 34F' are connected to additional connection pads, respectively 17E' and 17F', located on the back side of chip 3. Loop 39A further comprises an additional track 38E, located in interconnection layer 8 of upper chip 3 and connecting ends 32E' and 32F' of vias 30E' and 30F'. Connection pads 17E' and 17F' are respectively soldered to connection pads 17E and 17F.

Loop 39A of device 20D thus comprises, series-connected and in this order, in chip 5, via 30E, track 36B, and via 30F and, in chip 3, via 30F', track 38E, and via 30E'.

In the device 20D thus obtained, upper chip 5 is protected by loop 39 and by detection circuit 40 against attacks from its back side, and lower chip 3 is protected by loop 39A and by detection circuit 60A against attacks from its back side.

Figure 8:
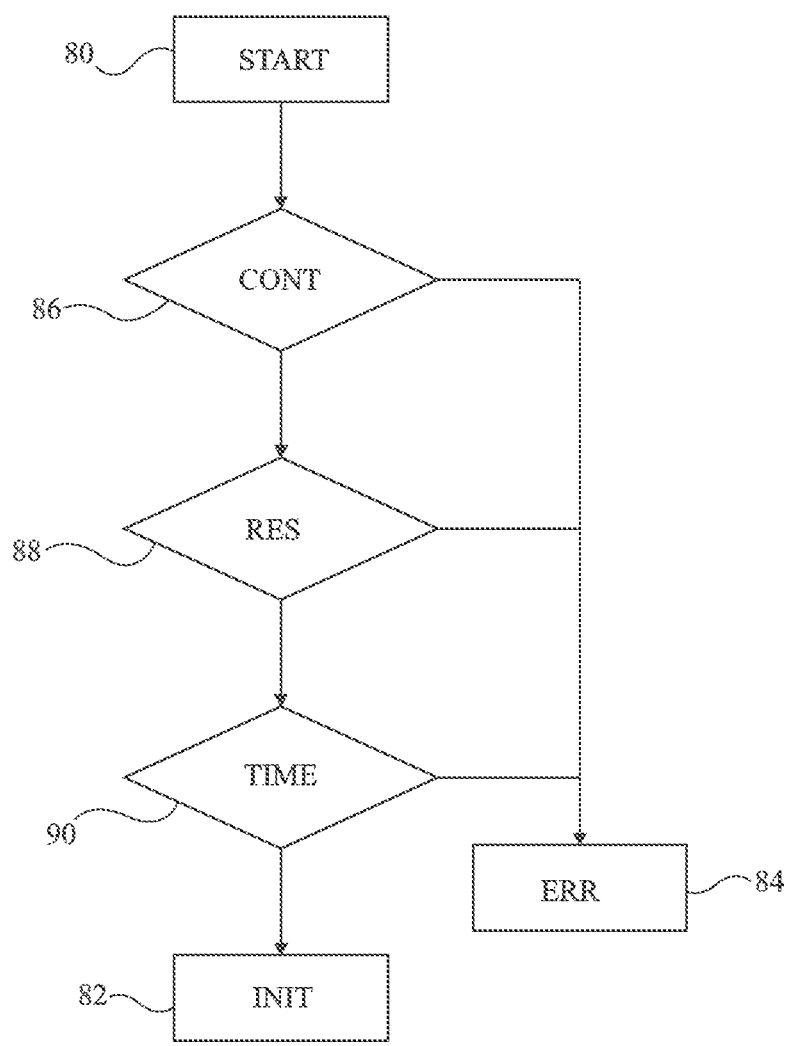
FIG. 8 is a diagram illustrating an example of an embodiment of a method of controlling a device comprising a stack of electronic chips.

FIG. 8 is a diagram illustrating an example of an embodiment of a method of controlling a device comprising a stack of electronic chips. This method may be implemented by a detection circuit, such as one of previously-described detection circuits 40, 60, or 60A, to detect a possible attack of a chip of the device by monitoring the electrical characteristics of a loop such as previously-described loops 39 and 39A.

The method starts at a step 80 (START), which for example corresponds to the connection of the chip comprising the detection circuit to a power source. The method ends either with a step 82 (INIT), or with a step 84 (ERR). Step 82 corresponds to the normal starting of the chip circuits, to perform the functions provided for the chip, for example, by using the confidential data of the chip. Step 82 is only implemented if no attack has been detected. Step 84 corresponds to the implementation of countermeasures intended to counter an attack.

After step 8o, the method comprises a step 86 (CONT) at which the electric continuity of the monitored loop is tested for the detection circuit. If a discontinuity is detected, countermeasure step 84 is implemented. Otherwise, the method carries on with a step 88 (RES).

At step 88, the electric resistance of the monitored loop is compared with a reference value by the detection circuit. The reference value for example corresponds to the resistance of the loop in the absence of an attack. The reference value may correspond to the resistance of another loop, for example, in the embodiment of FIG. 5, the monitored loop is loop 39 and the reference value is that of additional loop 39A. If the difference between the resistance of the loop and the reference value exceeds, in absolute value, a threshold, a countermeasure step 84 is implemented. Otherwise, the method carries on with a step 90 (TIME).

At step 9o, the detection circuit emits an electric pulse in the monitored loop. For example, the detection circuit applies to the monitored loop a rising potential edge between low and high potential values. The detection circuit compares with a reference duration the time taken by the pulse to flow through the monitored loop. The reference duration for example corresponds to the travel time in the absence of an attack. The reference duration may correspond to the time taken by a pulse to flow through another loop, for example, in the embodiment of FIG. 5, the monitored loop is loop 39 and the reference duration is that taken by a pulse to flow through additional loop 39A. If the difference between the travel time and the reference duration is greater, in absolute value, than a threshold, the method proceeds to countermeasure step 84. Otherwise, the chip starts normally at step 82.

Step 86 enables to detect an attack by a pirate having separated the chips. The pirate may they want to restore the connections between the chips, while maintaining an access to the back side which is desired to be attacked. The new connections modify the loop resistance and/or the time taken by a pulse to flow through the loop. The attack is then detected at step 88 or 90, and is then countered. An advantage of monitoring a plurality of electrical characteristics of the loop is that a particularly high protection level is thus obtained.

As a variation, the number of successively verified electrical characteristics may be different from 3. Further, the order of the successive verifications of the loop characteristics may be different from what has been described in the example of FIG. 8.

Specific embodiments have been described. Various alterations, modifications, and improvements will readily occur to those skilled in the art. In particular, although tracks 36 and 38 described in relation with FIG. 3 have serpentine shapes arranged in a plane located above the level of the circuit interconnection tracks, the serpentine may be partly or entirely located between interconnection tracks. Further, although serpentine shapes have been described, any other adapted track shape is possible.

Further, although the described embodiments comprise one or two loops, it is possible to provide more than two loops.

Further, although the described embodiments comprise two chips, devices comprising stacks of more than two chips may be provided.

Various embodiments with different variations have been described above. It should be noted that those skilled in the art may combine various elements of these various embodiments without showing any inventive step. In particular, tracks 36A, 36B, 38A, 38B, 38C, 38D of loops 39, 39A described in relation with FIGS. 4 to 7 may have serpentine shapes such as the serpentine shapes of tracks 36 and 38 described in relation with FIG. 3.

Further, the loops 39, 39A described in relation with FIGS. 5, 6, and 7 may each comprise more than two pairs of additional vias series-connected by tracks alternately arranged in lower chip 3 and in upper chip 5, as described in relation with FIG. 4.

Further, a device comprising a stack of two chips, each having its back side facing the other chip, comprising two loops 39 and 39A such as described in relation with FIG. 7, each of the two chips comprising a circuit for detecting an electrical characteristic of the two loops such as detection circuit 40 described in relation with FIG. 5, the two loops being common to the two detection circuits as described in relation with FIG. 6 for a single common loop, may be provided.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of protecting a first chip in a multi-chip stack, the method comprising:
    having the multi-chip stack comprising the first chip stacked on a second chip, the first chip comprising a first semiconductor substrate comprising first active devices at a first major surface and an opposite second major surface, the second chip comprising a second semiconductor substrate comprising second active devices at a first major surface and an opposite second major surface, the second major surface of the first semiconductor substrate facing the second semiconductor substrate;
    having a detection circuit disposed in the first chip;
    determining, at the detection circuit, an electrical characteristic of a conductive loop that extends over a top portion of the first chip, through the first chip and within a top portion of a second chip that is adjacent a bottom portion of the first chip, wherein the conductive loop comprises
        a first through via extending completely through the first semiconductor substrate and having a first end at the first major surface of the first semiconductor substrate and a second end at the second major surface of the first semiconductor substrate,
        a second through via extending completely through the first semiconductor substrate and having a first end at the first major surface of the first semiconductor substrate and a second end at the second major surface of the first semiconductor substrate,
        a first track disposed in the first chip, the first track connecting the first end of the first through via to the first end of the second through via, and
        a second track disposed in the second chip, the second track connecting the second end of the first through via to the second end of the second through via; and
    determining whether the electrical characteristic indicates that an attack is being made to determine contents or operation of the first chip.

2. The method of claim 1, further comprising:
    implementing countermeasures intended to stop the attack on the first chip when the electrical characteristic indicates that an attack is being made.

3. The method of claim 2, wherein implementing the countermeasures comprises:
    during operating mode of the first chip, detecting interruption of the conductive loop by the detection circuit located in the first chip;
    generating an alert signal in the first chip in response to detecting the interruption of the conductive loop; and
    triggering implementation of the countermeasures in response to the alert signal.

4. The method of claim 2, wherein the countermeasures comprise destroying confidential data.

5. The method of claim 2, wherein the countermeasures comprise stopping operations of circuits of the first chip.

6. The method of claim 1, wherein the electrical characteristic indicates physical separation of the first chip from the second chip.

7. The method of claim 1, wherein the electrical characteristic is a lack of continuity of the conductive loop.

8. The method of claim 1, wherein the electrical characteristic is a difference between a value of electrical resistance of the conductive loop and a reference value.

9. The method of claim 8, wherein determining the electrical characteristic comprises:
    measuring the value of electrical resistance of the conductive loop by a detection circuit located in the first chip; and
    comparing, by the detection circuit, the value of electrical resistance to the reference value.

10. The method of claim 1, wherein the electrical characteristic is a difference between a time taken by an electric pulse to flow through the conductive loop and a reference duration.

11. The method of claim 10, wherein determining the electrical characteristic comprises:
    emitting the electric pulse by a detection circuit located in the first chip;
    monitoring, by the detection circuit, the time taken by the electric pulse to flow through the conductive loop; and
    comparing, by the detection circuit, the time taken to the reference duration.

12. The method of claim 1, wherein determining the electrical characteristic of the conductive loop comprises:
    detecting a removal of a segment of the conductive loop in the top portion of the second chip, wherein the conductive loop is arranged in a serpentine pattern in the top portion of the second chip.

13. The method of claim 1, wherein the conductive loop further comprises:
    a third through via extending completely through the first semiconductor substrate and having a first end at the first major surface of the first semiconductor substrate and a second end at the second major surface of the first semiconductor substrate,
    a fourth through via extending completely through the first semiconductor substrate and having a first end at the first major surface of the first semiconductor substrate and a second end at the second major surface of the first semiconductor substrate,
    the second track comprising a first portion connecting the second end of the first through via to the second end of the third through via, and a second portion connecting the second end of the first through via to the second end of the third through via, and
    a third track disposed in the first chip, the third track connecting the first end of the third through via to the first end of the fourth through via.

14. The method of claim 1, further comprising determining, at a further detection circuit disposed on the second chip, the electrical characteristic of the conductive loop, wherein the conductive loop further comprises a third through via extending completely through the second semiconductor substrate and having a first end at the first major surface of the second semiconductor substrate and a second end at the second major surface of the second semiconductor substrate, a fourth through via extending completely through the second semiconductor substrate and having a first end at the first major surface of the second semiconductor substrate and a second end at the second major surface of the second semiconductor substrate, wherein the second track is connected to the second end of the first through via through the third through via and is connected to the second end of the second through via through the fourth through via.

15. The method of claim 1, further comprising determining, at a further detection circuit disposed in the second chip, an electrical characteristic of an additional conductive loop and determining whether the electrical characteristic of the additional conductive loop indicates that an attack is being made to determine contents or operation of the first chip, wherein the additional conductive loop comprises:

a third through via extending completely through the first semiconductor substrate and having a first end at the first major surface of the first semiconductor substrate and a second end at the second major surface of the first semiconductor substrate, a fourth through via extending completely through the first semiconductor substrate and having a first end at the first major surface of the first semiconductor substrate and a second end at the second major surface of the first semiconductor substrate, a third track disposed in the first chip, the third track connecting the first end of the third through via to the first end of the fourth through via, and a fourth track disposed in the second chip, the fourth track connecting the second end of the third through via to the second end of the fourth through via.

16. The method of claim 15, wherein the conductive loop further comprises a fifth through via extending completely through the second semiconductor substrate and having a first end at the first major surface of the second semiconductor substrate and a second end at the second major surface of the second semiconductor substrate, a sixth through via extending completely through the second semiconductor substrate and having a first end at the first major surface of the second semiconductor substrate and a second end at the second major surface of the second semiconductor substrate, wherein the second track is connected to the second end of the first through via through the fifth through via and is connected to the second end of the second through via through the sixth through via, and wherein the additional conductive loop further comprises a seventh through via extending completely through the second semiconductor substrate and having a first end at the first major surface of the second semiconductor substrate and a second end at the second major surface of the second semiconductor substrate, a eight through via extending completely through the second semiconductor substrate and having a first end at the first major surface of the second semiconductor substrate and a second end at the second major surface of the second semiconductor substrate, wherein the fourth track is connected to the second end of the third through via through the seventh through via and is connected to the second end of the fourth through via through the eight through via.

17. A method of protecting a first chip in a multi-chip stack, the method comprising:

having the multi-chip stack comprising the first chip stacked on a second chip;

detecting a physical separation of the first chip from the second chip using a first detection circuit and in response to a first loop becoming an open electrical circuit, wherein the first chip comprising a first semiconductor substrate, the first semiconductor substrate comprising a first interconnection layer at a front side and a back side, the first interconnection layer comprising the first detection circuit, the second chip is stacked with the first chip and located on the back side of the first chip, the first loop comprises a first portion disposed in the first chip and a second portion disposed in the second chip, and the first loop is a closed electric circuit; and triggering implementation of countermeasures intended to stop an attack of the first chip in response to detecting the physical separation, wherein the countermeasures comprise destroying confidential data or stopping operation of circuits of the first chip.

18. The method of claim 17, further comprising:

detecting the physical separation of the first chip from the second chip using a second detection circuit and in response to a second loop becoming an open electrical circuit, wherein the second loop comprises a third portion disposed in the first chip and a fourth portion disposed in the second chip, and the second loop is a closed electric circuit; and triggering implementation of countermeasures intended to stop the attack of the first chip in response to detecting the physical separation.

19. The method of claim 18, wherein the second detection circuit is disposed in the second chip.

20. The method of claim 17, wherein detecting the physical separation comprises:

during operating mode of the first chip, detecting interruption of the first loop by the first detection circuit; and generating an alert signal in the first chip in response to detecting the interruption of the first loop, and wherein triggering implementation of countermeasures comprises:

triggering implementation of countermeasures in response to the alert signal.

21. The method of claim 18, wherein the second chip comprises a second semiconductor substrate, the second semiconductor substrate comprising a second interconnection layer that comprises the second detection circuit.

22. A method of protecting a first chip in a multi-chip stack, the method comprising:

detecting a physical separation of the first chip from a second chip using a detection circuit and in response to a first loop becoming an open electrical circuit;

triggering, in response to detecting the physical separation, implementation of countermeasures intended to stop an attack of the first chip, wherein the countermeasures comprise destroying confidential data or stopping operation of circuits of the first chip;

wherein the first chip comprises
- a front side and a back side,
- first and second connection pads on the back side of the first chip,
- a first through via completely extending from the front side of the first chip to the back side of the first chip, the first through via having a first end at the front side of the first chip and a second end at the back side of the first chip, wherein the first connection pad is connected to the first through via,
- a second through via completely extending from the front side of the first chip to the back side of the first chip, the second through via having a first end at the front side of the first chip and a second end at the back side of the first chip, wherein the second connection pad is connected to the second through via,
- a first track located at the front side of the first chip, the first track electrically connecting the first end of the first through via to the first end of the second through via, and
- the detection circuit located in the first chip and electrically coupled to the first track; and wherein the second chip is stacked with the first chip and located on the back side of the first chip, and wherein the second chip comprises
- third and fourth connection pads, wherein the first connection pad is soldered to the third connection pad, and wherein the second connection pad is soldered to the fourth connection pad, and
- a second track located at the second chip, the second track electrically connecting the second end of the first through via to the second end of the second through via.

23. The method of claim 22, further comprising:
detecting the physical separation of the first chip from the second chip using the detection circuit and in response to a second loop becoming an open electrical circuit.

24. The method of claim 22, wherein detecting the physical separation comprises:
- during operating mode of the first chip, detecting interruption of the first loop by the detection circuit; and
- generating an alert signal in the first chip in response to detecting the interruption of the first loop, and wherein triggering implementation of counter measures comprises:
- triggering implementation of countermeasures in response to the alert signal.

* * * * *